United States Patent [19]

Nagatani et al.

[11] Patent Number: 5,028,512

[45] Date of Patent: Jul. 2, 1991

[54] METHOD OF MANUFACTURING PHOTOSENSITIVE PRINTING PLATES COMPRISING APPLYING A POWDERED SURFACE

[75] Inventors: Toshio Nagatani, Musashino; Minoru Seino, Hachioji; Toru Okamoto, Kamagaya; Chihiro Eguchi, Yokohama, all of Japan

[73] Assignee: Konica Corporation and Mitsubishi Kasei Corporation, Tokyo, Japan

[21] Appl. No.: 432,354

[22] Filed: Nov. 3, 1989

Related U.S. Application Data

[60] Division of Ser. No. 339,866, Apr. 14, 1989, abandoned, which is a continuation of Ser. No. 166,803, Mar. 3, 1988, abandoned, which is a continuation of Ser. No. 937,472, Dec. 2, 1986, abandoned, which is a continuation of Ser. No. 818,991, Jan. 13, 1986, abandoned, which is a continuation of Ser. No. 682,482, Dec. 17, 1984, abandoned, which is a continuation of Ser. No. 551,508, Nov. 14, 1983, abandoned, which is a continuation of Ser. No. 299,634, Sep. 4, 1981, abandoned, which is a continuation of Ser. No. 55,741, Jul. 9, 1979, abandoned.

[30] Foreign Application Priority Data

Jul. 15, 1978 [JP] Japan .................................. 53-86533

[51] Int. Cl.$^5$ .......................... G03F 7/02; G03F 7/08; G03F 7/16

[52] U.S. Cl. ........................................ 430/300; 430/49; 430/144; 430/162; 430/167; 430/168; 430/169; 430/254; 430/257; 430/259; 430/269; 430/271; 430/273; 430/291; 430/302; 430/327; 430/735; 430/950; 430/961

[58] Field of Search ............... 430/168, 935, 169, 270, 430/162, 167, 273, 49, 300, 302, 950, 961, 144, 269, 291, 161, 259, 254, 257, 327

[56] References Cited

U.S. PATENT DOCUMENTS

| | | | |
|---|---|---|---|
| 3,687,703 | 8/1972 | Ohashi et al. | 430/935 |
| 3,891,443 | 6/1975 | Halpern et al. | 430/259 |
| 4,072,527 | 2/1978 | Fan | 430/273 |
| 4,075,011 | 2/1978 | Iwasa et al. | 430/31 |
| 4,100,321 | 7/1978 | Schlesinger et al. | 430/144 |
| 4,126,460 | 11/1978 | Okishi | 430/950 |
| 4,142,894 | 3/1979 | Hori et al. | 430/950 |
| 4,168,979 | 9/1979 | Okishi et al. | 430/162 |
| 4,252,879 | 2/1981 | Inoue et al. | 430/189 |
| 4,288,526 | 9/1981 | Oda et al. | 430/950 |

FOREIGN PATENT DOCUMENTS

2606793 9/1976 Fed. Rep. of Germany .
1542131 3/1979 Fed. Rep. of Germany .

OTHER PUBLICATIONS

"Japanese Printer", 53(10), 23, 1970 (English Translation).

*Primary Examiner*—Charles L. Bowers, Jr.
*Assistant Examiner*—Patrick A. Doody
*Attorney, Agent, or Firm*—Jordan B. Bierman; Bierman and Muserlian

[57] ABSTRACT

Printing plates having a photosensitive layer coated on a support wherein said photosensitive layer contains a powdered solid adhered to the surface of said plate by means of powdering followed by the application of heat or solvent before exposure. Said powders are capable of being removed from said surface during the developing process.

15 Claims, No Drawings

METHOD OF MANUFACTURING PHOTOSENSITIVE PRINTING PLATES COMPRISING APPLYING A POWDERED SURFACE

This application is a division of application Ser. No. 339,866, filed Apr. 14, 1989 now abandoned, which is a continuation of application Ser. No. 166,803, filed Mar. 3, 1988, abandoned, which is a continuation of application Ser. No. 937,472, filed Dec. 2, 1986, abandoned, which is a continuation of application Ser. No. 818,991, filed Jan. 13, 1986, abandoned, which is a continuation of application Ser. No. 682,482, filed Dec. 17, 1984, abandoned, which is a continuation of application Ser. No. 551,508, filed Nov. 14, 1983, abandoned, which is a continuation of application Ser. No. 299,634, filed Sept. 4, 1981, abandoned which is a continuation of application Ser. No. 55,741, filed Jul. 9, 1979, abandoned which in turn claims priority of Japanese application No. 86533, filed Jul. 15, 1978.

This invention relates to photosensitive printing plates which have been improved by powdering in adaptability to "vacuum contact".

In the conventional practice of contact printing of film original on photosensitive printing plates, there has been employed a process using a vacuum printing frame (this process is called "the vacuum contact process") in which a film original superposed on a photosensitive printing plate is placed between a glass plate and rubber sheet of the frame and a space between the glass plate and rubber sheet is evacuated and thereby to bring the film original into intimate contact with the photosensitive printing plate.

In connection with this vacuum contact process, there have been known various procedures for obtaining in a short period of time a state of sufficiently intimate contact all over the surfaces to be brought into contact with each other. That is, Inoue and Iino, "Japan Printer," 53(10), 23(1970) and Ishiyama et al., "Printing Information," 33(11), 90(1973) disclose processes in which the surface at the side of a photosensitive layer of a photosensitive printing plate is sprayed, prior to the contact printing step, by mechanical means without using any dispersing medium other than gas such as air or the like, with powder of a solid such as talc. According to this powdering technique, photosensitive printing plates can be improved in adaptability to vacuum contact by a simple procedure wherein the plate is merely sprayed on the surface of the side of the photosensitive layer with a commercially available talc or the like powder for anti-offset purposes. However, such powdering technique on the other hand has such drawbacks as mentioned below. That is, generally the powdering technique is often applied, prior to the contact printing step, to photosensitive printing plates and consequently the working environment comes to be polluted with the scattered solid powder resulting from the powdering operation effected in a plate making workshop. In addition, the scattered powder causes not only various hindrance in the way of the printing plate making step but also is undesirable from the standpoint of working environment hygiene, and a problem of cleaning apparatuses and equipments installed around the workshop, which cleaning is believed to be necessary after the powdering step, is not to be slightly disregarded from the viewpoint of working efficiency. Furthermore, the solid powder sprayed by the powdering technique on the surface of printing plate is sometimes liable to fall off therefrom during handling of the thus treated plate, with the result that not only the circumstances there are polluted by the fallen-off powder but also the expected adaptability of the resulting plate to vacuum contact is not attained.

Japanese Laid-Open-to-Public Publication (Pre-Exam.) No. 125805/1975, on the other hand, discloses photosensitive printing plates having formed on the surface of the side of the photosensitive layer thereof a mat layer. By virtue of the mat layer so formed, the printing plates as prepared are certainly improved in adaptability to vacuum contact technique. However, the mat layer not only prevents permeation into the photosensitive layer of a developer and thereby to deteriorate developability of said photosensitive layer but also remains in parts after development image area of the developed layer and tends to hinder said portions in their affinity for ink and, moreover, dissolves in the developer to show a strong tendency to increase in fatigue of said developer.

Further, Japanese Laid-Open-to-Public Publication (Pre-Exam.) No. 111102/1976 discloses photosensitive printing plates having formed on the surface a micropatterned coating. By virtue of the procedure according to this Publication, an improvement to a certain extent of an adverse effect (retardation of development) on developability can be achieved when compared with the above-mentioned procedure involving formation of the mat layer. But it is still inferior to the powdering technique. Particularly, in case of development with a fatigued developer, no sufficient removal of the micropatterned coating from the plate is possible and hence there is observed a tendency which will bring about the so-called "strong scumming" in the non-image area of said plate. In order to attain a sufficient vacuum contact, moreover, it becomes necessary to use a binder or a matting agent in an amount several times that used in the powdering technique, with the result that the developer used there is liable to fatigue. Further, the cost of coating operation increases because of complexities of equipments and process steps necessary for performing the formation of the micropatterned coating and, in addition thereto, there is a case where no micropatterned coating can be formed depending on a composition or physical properties of surface of the photosensitive layer provided on the printing plate.

Furthermore, Japanese Laid-Open-to-Public Publication (Pre-Exam.) No. 98505/1976 discloses a process for coating photosensitive printing plates on the surface with non-adhesive wax formed or particulate resins with the view of dissolving a problem that a coating formed for improving the adaptability to vacuum contact will often stain a film original in contact therewith. In this process, however, there are such drawbacks that the coating so formed does not strongly adhere to the surface of photosensitive printing plate and is liable to fall of therefrom and when the coating is uniformly formed all over the surface of the plate for attaining a strong adhesion, permeation into the photosensitive layer of the developer is hindered thereby.

The primary object of the present invention is to provide photosensitive printing plates which are improved in adaptability to vacuum contact and which exercise less an adverse effect on developability and also fatigue of a developer.

The second object of the present invention is to provide photosensitive printing plates which are improved in adaptability to vacuum contact and which exercise less adverse effects on lay of an ink on the image area of the plate, and also on the so-called strong scumming.

The third object of the present invention is to provide photosensitive printing plates which are improved in adaptability to vacuum contact, wherein the surface treatment for improving the adaptability to vacuum contact is easily practicable.

These objects of the present invention can be accomplished by powdering a solid powder on the surface of a photosensitive printing plate, followed by sticking the thus applied powder fast to said surface.

The solid powder used in the present invention may be those which, after being powdered on the surface at the side of a photosensitive layer of the photosensitive printing plate, are capable of sticking on application of heat fast to said surface (hereinafter sticking fast in this way will be called "sticking by heat"), or are capable of sticking fast on application of solvent to said surface (hereinafter sticking fast in this way called "sticking by solvent"). The solid powder suitable for application to sticking by heat is a powder consisting essentially of a substance or composition having a first order transition point or second order transition point lower than the first order transition point of a photosensitive layer of the photosensitive printing plate, or a powder whose surface layer is composed of said substance or said composition, the first order and second order transition points of said substance or said composition being preferably higher than 40° C. and the first order or second order trasnsition point of said substance or said composition being preferably lower than the first order transition point of said photosensitive layer. Preferable as examples of the substance of solid powder suitable for application to sticking by heat are polyvinyl acetate, polyvinylidene chloride, polyethylene oxide, polyethylene glycol, polyacrylic acid, polymethacrylic acid, polyacrylamide, polymethacrylamide, polyacrylate such as polybutylacrylate, polymethacrylate, polystyrene and derivatives thereof, and copolymers of monomers of these polymers, polyvinyl methyl ether, epoxy resins, phenol resins, polyamides, polyvinyl butyral, etc. The solid powder suitable for application to sticking by solvent is a powder being soluble in ordinary solvents. Suitable as the substance of a solid powder for application to sticking by solvent are gum arabic, cellulose, starch and other polysaccharides, polyvinyl pyrrolidone, polyvinyl alcohol, polyvinyl acetate, polyacrylic acid, polymethacrylic acid, polyacrylamide, polyacrylate, polymethacrylate, polystyrene and derivatives thereof, and copolymers of monomers of these polymers, polyvinyl methyl ether, epoxy resins, phenol resins, polyamides, polyvinyl butyral, etc.

Molecular weights of these polymers used for a solid powder are 5,000 to 200,000, preferably 8,000 to 100,000.

The solid powder used in the present invention is preferably soluble in developers for photosensitive printing plate. An aqueous liquid of strong alkali or an a liquid containing an organic solvent is generally used for the developer. An aqueous liquid of a strong alkali used as the developer has a pH value of greater than 9, preferably from 10 to 13. An organic solvent used for the developer includes alcohol (e.g. methanol, ethanol, ethylenglycol, ethylenglycolmonoether, ethylenglycolmonophenylether, diethyleneglycolmonoethylether, etc.), ketones (e.g. methylethylketone, methylisobutylketone, γ-butylolactone, etc.), ethers (e.g. tetrahydrofurane, ethylenglycolmonoethyletheracetate, diethylenglycolmonoethyletheracetate, etc.). To photosensitive printing plates that can be processed with aqueous liquids of such strong alkalis as silicates and the like, preferably applicable examples of substance of a solid powder are hydroxyethylcellulose, hydroxypropylmethylcellulose, carboxymethylcellulose, polyvinyl pyrrolidone, polyvinyl alcohol, polyacrylic acid, polyacrylate, polyacrylates containing a polystyrene derivative and a monomer having phenolic or alcoholic hydroxy group, polyacrylamides, phenol resins, etc. To photosensitive printing plates for which can be developed by a developer containing an organic solvent, preferably applicable examples of substance of a solid powder are cellulose derivatives, polyvinyl pyrrolidone, polyvinyl alcohol, polyvinyl acetate, polyvinylidene chloride, polyacrylic acid, polyacrylamides, polyacrylate, polystyrene, copolymers consisting of two or more monomers selected from acrylic acid, acrylamide, acrylate and styrene, epoxy resins, phenol resins, etc. Furthermore, a material commonly used and widely known as a matting agent for roughening the surface of a solid (for example, finely pulverized powder of a solid such as silica, zinc oxide, titanium oxide, zirconium oxide, alumina or the like) may be wrapped on the surface in the above-mentioned substance of a solid powder.

Though not particularly limited, the solid powder which can be used in the present invention may be those spherical in shape or those indefinite in shape obtained by pulverizing the solid powder material with a ball mill, jet mill or the like. Suitably, the range of diameter of the solid powder is between about 0.5 to about 40μ, preferably between 1 to 32μ, and especially preferably 6 to 20μ. Further, the effective height of the solid powder, which has stuck fast to the plate surface in such a way as sticking by heat or sticking by solvent, is 1 to 12μ, preferably 3 to 8μ, from the surface of the plate. If the particle diameter of solid powder is excessively small, the effect for shortening the time necessary for attaining vacuum contact becomes small and, on the other hand, if the diameter is excessively large, reproducibility of small dot images or sharpness of images deteriorates. If the solid powder which is applied to the photosensitive printing plate has a particle diameter falling within the above-mentioned ranges, the resulting plate is found favorable in adaptability to vacuum contact even when the amount of the powder which stuck fast to the plate surface is small, and no adverse effect on the small dot reproducibility is produced. In this connection, the solid powder may be made uniform in particle diameter according to the generally known classifying procedure so as to fall within the above-mentioned ranges.

To stick the solid powder fast to the surface of photosensitive printing plate according to the present invention, the powder can be first applied by powdering to the plate surface and the powder thus applied can be then stuck fast to said surface by application thereto of heat or by the use of solvents.

Besides known procedures, for example, fluidized bed, static spray, static fluidized bed, etc. disclosed in pages 426 to 431 of J. J. Sokol and R. C. Hendrickson, "Plastic Eng. Handbook (1976)", the powdering in the present invention may be carried out according to various procedures such as air spray, brushing, puffing, etc. The amount of solid powder to be stuck fast to the surface of photosensitive printing plate is suitably 0.5 to 1,000 particles, preferably, 1 to 500 particles, especially preferably 2 to 50, per 1 mm² of the plate surface. The solid powder applied by powdering to the surface of photosensitive printing plate is generally distributed randomly.

The solid powder applied by powdering to the surface of photosensitive printing plate may be stuck fast to said surface according to any of the following procedures.

(1) Against the surface of photosensitive printing plate subjected to powdering is blown a hot air, or the plate subjected on the surface to powdering is passed through a hot air chamber or between hot rollers to melt at least a part of particles of the solid powder, thereby sticking the powder fast to the plate surface. In case of employing this procedure, a first or second order transition point of the solid powder is preferably lower by about 10° to about 40° C. than a first transition point of a photosensitive layer of the plate. Temperatures applied to these processes may be in a range of 50° to 300° C.

(2) After coating a photosensitive layer on a support, a solid powder is applied by powdering to the surface of photosensitive printing plate halfway through the drying step (particularly preferably in the state of falling rate of drying) wherein the solvent used still sufficiently remains, and the powder is locally dissolved by means of the remaining solvent to stick fast to the photosensitive layer. While an amount of remaining solvent suitable for application of powdering to the surface may be determined by properties of a solvent and a solid powder applied to, generally it is within a range of 3 to 50% by weight of a coating solution, and preferably 5 to 30% by weight.

Embodiments of the invention are not restricted to those mentioned above. One example of other procedures is an application of a solvent of the powders to the powdered photosensitive surface by means of blowing a vapor of a solvent which may be warm or hot. Another example is an application of a solvent and such heat procedure as the above-mentioned hot roller process.

In the present invention, the term "first order transition point" means a Vicat softening point, which can be tested according to ASTM designation D.1525-70, and the term "second order transition point" means a generally known glass transition point, which can be tested according to, for example, description of pages 43 to 45 of "Textbook of Polymer Chemistry" by Fred W. Billmeyer, Jr. (Interscience Publishers, Inc., New York, 1957).

The above-mentioned procedures may be used in combination with two or more of other means, though these procedures are usually adopted singly, and such means of applying pressure to the solid powder may be employed in combination with said procedures. Besides the aforesaid procedures, there may also be proposed various means of sticking the solid powder fast to the surface of photosensitive printing plate. In short, however, such means suitable for the purpose may be those, according to which the solid powder is allowed to stick fast to the photosensitive layer of the printing plate to such an extent that no excessive deformation is caused thereby while the powder sticks fast to the layer. Of the procedures adoptable in the present invention to stick the solid powder fast to the surface of photosensitive printing plate, the above-mentioned procedure (1) is preferred in view of the degree of stickness as well as of simplicity of the sticking process.

The expression "sticking fast to" as used in the present invention is intended to mean that in the course of plate making step, prior to development treatment, the solid powder that has been applied by powdering and stuck fast to the surface of photosensitive printing plate does not readily fall off therefrom on friction or contact that occurs during usual plate making operation, particularly to such an extent that when undesirable other substances adhere to the surface at the side of photosensitive layer of the photosensitive printing plate and when said substances are wiped with a cloth or the like, the solid powder may not totally be removed together with said other substances from said surface. In that case, the amount of the solid powder stuck fast to the said surface is not necessarily to correspond to the total amount of the powder applied to and present on the printing plate, but may be such an amount that the adaptability of the plate can substantially be improved even when parts of the powders thus stuck fall off from said plate. However, it is desirable to control the amount of the solid powder that may fall off from the printing plate as small as possible since parts of the powder thus fallen off will pollute the work environment and cause undesirable consequences. Accordingly, it is most preferable that the solid powder is allowed to stick fast to the printing plate surface to such an extent that the total amount of the powder thus stuck does not substantially fall off from the plate during usual plate making step.

The photosensitive printing plates according to the present invention, in which the solid powder is allowed to stick fast to the surface of the plate, are fundamentally those which have a support and thereon a photosensitive layer and which include photosensitive printing plates for use in the preparation of plates for lithography, relief printing, intaglio printing, etc.

The support referred to above includes plate-like materials with dimensional stability which have heretofore been used as supports for printing purposes, and these materials can suitably be used in the present invention. Such supports include paper, paper laminated with plastics (e.g. polyethylene, polypropylene, polystyrene, etc.), plates of metals such as aluminum (including aluminum alloys), zinc, iron, steel and the like, films of plastics, e.g. cellulose diacetate, cellulose triacetate, cellulose propionate, cellulose nitrate, polyethylene terephthalate, polyethylene, polystyrene, polypropylene, polycarbonate, polyvinyl acetal, and the like, and paper or plastic films overlaid by lamination or evaporation with such metals as mentioned above. From the supports as illustrated above, any support suitable for the purpose may be selected according to the type of printing plate as intended. In the case of photosensitive lithographic printing plate, for instance, preferable as supports are aluminum plates and such composite sheets prepared by bonding aluminum sheets onto polyethylene terephthalate films as disclosed in Japanese Patent Publication No. 18327/1973. In the case of photosensitive relief printing plate, preferable are polyethylene terephthalate films, aluminum plates, iron plates and the like.

The supports may be subjected to surface treatment, if necessary. In the case of photosensitive lithographic printing plate, for instance, the support surface may be subjected to hydrophilization treatment. The hydrophilization treatment may be carried out by various means. In the case of supports with plastic surfaces, for instance, there are various procedures known as surface treatment in the technical field of so-called silver salt photography, such as chemical treatment, electrical discharge treatment, flame treatment, ultraviolet treatment, high-frequency treatment, glow discharge treatment, active plasma treatment and laser treatment, and a procedure in which a sub layer is coated on said plastic surface after completion of the above-mentioned surface treatment.

In the case of supports with metal surfaces, particularly those of aluminum, preferably applicable as surface treatment is graining treatment, immersion treatment with aqueous solution of sodium silicate, phosphate of potassium fluorozirconate or the like, or anodic oxidation treatment. Preferably usable as metal surfaces of support are aluminum plates subjected to graining followed by immersion treatment with an aqueous sodium silicate solution as disclosed in U.S. Pat. No. 2,714,066 and aluminum plates subjected to anodic oxidation followed by immersion with an aqueous solution of silicate of alkali metal as disclosed in U.S. Pat. No. 3,181,461. The above-mentioned anodic oxidation treatment may be carried out by subjecting to electrolysis an aluminum plate used as an anode in an electrolytic solution consisting, either singly or in combination of two or more, of aqueous or non-aqueous solutions of inorganic acids, e.g. phosphoric acid, chromic acid, sulfuric acid, boric acid, etc., or organic acids, e.g. oxalic acid, sulfamic acid, etc.

Besides the purpose of rendering the surface of support hydrophilic, the above-mentioned hydrophilization treatment is carried out with the view of inhibiting undesirable and harmful reactions with a photosensitive composition to be coated thereon for forming a photosensitive layer or of enhancing the adhesion between said photosensitive layer and said surface.

As photosensitive materials to be coated on supports, there may be used any materials so long as they change in their solubility or swelling property relative to developers by means of exposure. Particularly preferable as the photosensitive materials are photosensitive compositions comprising diazo compounds, e.g. diazo resins, and shellac (Japanese Laid-Open-to-Public Publn. No. 24404/1972), those comprising poly(hydroxyethylmethacrylate) and diazo resins, and diazo resins and soluble polyamide resins (U.S. Pat. No. 3,751,257), those comprising photosensitive products of azide and epoxy resins (U.S. Pat. No. 2,852,379), and photosensitive compositions which are useful as negative working type photosensitive compositions capable of becoming insoluble by the action of actinic ray, said compositions comprising photosensitive resins having in such a molecule as represented by polyvinyl cinnamate at least two unsaturated double bonds and bringing about dimerization reaction on irradiation of actinic ray to become insoluble, such as photosensitive products of azide, diazo resins, etc., for instance, derivatives of polyvinyl cinnamate as disclosed in the specifications of British Patents Nos. 843,543 and 966,297 and U.S. Pat. No. 2,725,372, prepolymers of diallyl phthalate as disclosed in U.S. Pat. No. 3,462,267 and such ethylenically unsaturated compounds as having in the molecule at least two unsaturated double bonds and bringing about polymerization reaction on irradiation of actinic ray as disclosed in Japanese Patent Publication No. 8495/1960, and a suitable binder, for example, polyvinyl alcohol or such compounds being derivatives of cellulose and having on the side chain carboxy groups, e.g. polyvinyl-H-phthalate and carboxymethylcellulose, or copolymers of methyl methacrylate and methacrylic acid. The aforesaid ethylenically unsaturated compounds disclosed in Japanese Patent Publn. No. 8495/1960 include unsaturated esters of polyol, e.g. ethylenediacrylate, diethyleneglycoldiacrylate, glyceloldiacrylate, glyceloltriacrylate, ethylenedimethacrylate, 1,3-propylenediacrylate, 1,4-cyclohexanediolacrylate, 1,4-benzenedioldiacrylate, pentaerythritoltetraacrylate, 1,3-propyleneglycoldiacrylate, pento-1,5-diol-di-methacrylate, pentaerythritoltriacrylate, bisacrylate and methacrylate of polyethylene glycol having molecular weight of 50 to 500, unsaturated amides, particularly amide of α-methylenecarboxylic acid and α,ω-diamine and ω-diamine having intermediary oxygen, e.g. methylenebisacrylamide and diethylenetriaminetrisacrylamide, divinyl succinate, divinyl adipate, divinyl phthalate, divinyl terephthalate, divinylbenzene-1,3-disulfonate, or such a corresponding compound that contains methacrylate or methacrylamide instead of acrylate or acrylamide in the above-mentioned compounds respectively, etc. Useful as positive working type photosensitive compositions are those which comprise such matters as disclosed in U.S. Pat. Nos. 3,635,709, 3,061,430 and 3,061,120, photosensitive products of o-diazo oxide type, phosphotungstates of diazo resins (Japanese Patent Publn. No. 7663/1964), and potassium ferrocyanide of diazo resins (U.S. Pat. No. 3,113,023). Furthermore, such photosensitive compositions containing linear polyamides and monomers having addition polymerizable unsaturations as disclosed in the specifications of U.S. Pat. Nos. 3,081,168, 3,486,903, 3,512,971 and 3,615,629 are also useful.

The photosensitive printing plates used in the present invention, to the surface of which the solid powder is allowed to stick fast, have their fundamental structure wherein the support has thereon a photosensitive layer consisting essentially of such photosensitive materials as illustrated hereinbefore. In the present invention, however, there are also usable such photosensitive printing plates having further been provided on the surface of photosensitive layer with various resins. Concretely, these plates as disclosed in Japanese Patent Publication No. 11558/1962 have a support and thereon a photosensitive layer and thereon a lipophilic, hydrophilic, water-insoluble or solvent-softening resin layer.

The photosensitive printing plates obtained according to the present invention successfully accomplish the aforesaid objects of the invention and, at the same time, possess such characteristic advantages over the prior art photosensitive printing plates improved in adaptability to vacuum contact that the present plates are less in adverse effect on ink-laying property of the photosensitive layer irrespective of the composition of said layer and will not suffer from deterioration of the ink-laying property even when stored for an extended period of time.

The present invention is concretely illustrated below with reference to examples, but it should be construed that the invention is not limited to these examples.

EXAMPLE 1

An aluminum plate of 0.3 mm in thickness was subjected to depth mat treatment by immersing the plate for 3 minutes in a 10% aqueous sodium triphosphate kept at 80° C., followed by water-washing, and dipping the thus treated plate into a 70% nitric acid. After further washing with water, the treated place was dipped in a aqueous solution of 2% potassium ziconium fluoride at 80° C. for 3 minutes, and water-washed and then dried. The aluminum plate thus treated was coated with a solution of the following composition and then dried to form a photosensitive layer thereon. The amount of the solution coated was 500 mg/m² after drying, and a first order transition point of the photosensitive layer was 250° C.

2-Diazo-1-naphthol-5-sulfonate of polyhydroxyphenyl (disclosed in Example 1 of U.S. Pat. No. 3,635,709): 5 g
Cyclohexane: 80 g Onto the thus formed photosensitive layer was applied by powdering with a spray gun a solid powder consisting of each resin as indicated in Table 1, said resin having been pulverized with a ball mill and classified by means of a classifier (a zigzag classifier manufactured by Alpime Co., Ltd.), and the layer was then exposed for 5 seconds to an air bath kept at 150° C. to stick the powder fast to the surface of said layer. Using the samples of photosensitive printing plates thus prepared, the time required in each sample for attaining vacuum contact in the test conducted according to the vacuum contact method was measured to obtain the result as shown in column I of Table 1, and similarly the time as measured but after manually wiping the surface of the sample with a cotton glove was shown in column II of Table 1. Furthermore, using comparative samples prepared in the same manner as in the samples shown in column I of Table 1 except that the sticking step was omitted, the time required for attaining vacuum contact was measured likewise but after wiping the surface of the comparative sample in the same manner as in column II of Table 1 to obtain the result as shown in column III of Table 1. (In the subsequent examples, the meanings of columns I, II and III are the same as in Example 1.) In addition thereto, the results obtained in the measurement of samples which had not been subjected to any processing, such as powdering, to improve adaptability thereof to vacuum contact were shown at the bottom of Table 1.

In the above-mentioned test as conducted, a photographic film with 20% dot image, prepared from Sakura OI-100E film, (500×700 mm) and the sample (800×1003 mm) were brought into contact with each other using a horizontal vacuum printing frame of Model KD-P1 (manufactured by Kamo Denki Kenkyu Sho) to attain vacuum contact between them.

vacuum contact time was shortened to about ½ to about 1/6 of that required for the comparative samples as well as for the control, and further that as compared with the comparative samples which had merely been subjected to powdering, the solid powder stuck fast to the present samples was difficult to fall off.

Each of the samples as prepared above was exposed for 3 minutes to light from a 2 KW metal halide lamp at the distance of 1.25 meters, followed by a 45-second immersion development in a 1% aqueous sodium trisilicate solution. A positive image like the original was obtained on each sample without observing any adverse effect of the solid powder on the development performance. The samples shown in the above table were all found to be equal in printing performance to one another. That is, in all cases no influence exerted on the development as well as the printing performance was observed even when the solid powder was allowed to stick fast to the surface of photosensitive printing plate.

EXAMPLE 2

On an aluminum plate prepared in the same manner as in Example 1 was coated a coating solution of the following composition in a proportion of 1 g/m² to form a photosensitive layer.
meta-Cresol formaldehyde novolak resin: 5 g
1,2-Naphthoquinonediazido-sulfonate of meta-cresol-formaldehyde novolak resin: 1 g
Methanol: 80 g At the time when the solvent methanol still remained in a proportion of 1.5 to 20 g/m² in the photosensitive layer of each aluminum plate was applied to the plate surface by powdering a solid powder obtained by pulverizing and classifying each resin indicated in Table 2 in the same manner as in Example 1. Using the samples of photosensitive printing plates thus prepared, the measurements were conducted to obtain (I) vacuum contact time, (II) vacuum contact time as measured after manually wiping the photosensitive layer surface with a cotton glove, and (III) the time required for attaining vacuum contact when the photosensitive layer was completely dried, followed by powdering with the same kind of resin powder, and then the layer surface was wiped with a cotton glove and, furthermore, the time required for attaining vacuum contact when the plates had not been subjected to powdering. The results obtained were as shown in Table 2.

TABLE 1

| Resin used | 1st transition point (°C.) | 2nd transition point (°C.) | Particle diameter of powder (μ) | Amount of powder per 1 mm² (number of particles) | Vacuum contact time (second) | | |
|---|---|---|---|---|---|---|---|
| | | | | | I | II | III |
| meta-Cresol-formaldehyde novolak resin | 105 | — | 0.5–ε | 70 | 35 | 38 | 112 |
| Copolymer of styrene, methyl methacrylate and methacrylic acid (2:2:1) | 100 | 50 | 1–7 | 170 | 24 | 29 | 105 |
| Copolymer of styrene, methyl methacrylate, butyl methacrylate and acrylic acid (3:1:1:2) | 100 | 60 | 1–8 | 60 | 40 | 45 | 98 |
| Copolymer of styrene, methyl methacrylate, butyl methacrylate and acrylic acid (3:1:1:2) | 100 | 60 | 5–15 | 6 | 45 | 48 | 100 |
| Polymethacrylic acid | 200 | 40 | 2–12 | 30 | 52 | 55 | 120 |
| Blank | | | — | — | | 124 | |

It is understood from the above table that by virtue of using the present photosensitive printing plates, the

TABLE 2

| Resin used | Particle diameter of powder (μ) | Amount of powder per 1 mm² (number of particles) | Vacuum contact time (second) (I) | (II) | (III) |
| --- | --- | --- | --- | --- | --- |
| Phenol-formaldehyde novolak resin | 1–12 | 65 | 42 | 45 | 150 |
| Polyacrylic acid | 0.5–11 | 80 | 25 | 29 | 151 |
| Copolymer (2:1:1) of styrene, methyl methacrylate and acrylic acid | 1–8 | 55 | 59 | 63 | 142 |
| Copolymer (1:1) of hydroxyethyl-methacrylate and methyl methacrylate | 2–7 | 60 | 48 | 51 | 152 |
| Blank | — | — | | | 178 |

It is understood from the above table that in the case of the present photosensitive printing plates the vacuum contact time could sharply be shortened in the same way as in Example 1 and the solid powder stuck fast thereto was difficult to fall off. In point of the development as well as printing performance, no problem was observed at all in the photosensitive printing plates as obtained in the present example.

EXAMPLE 3

An aluminum plate of 0.3 mm in thickness was degreased by immersing the plate for 1 minute in a 10% aqueous sodium triphosphate kept at 80° C. After water-washing, the plate was grained by rubbing it on the surface with a nylon brush while pouring an aqueous pumice suspension out on to said surface. Subsequently, the plate was immersed, after being thoroughly washed with water, for 3 minutes in a 5% aqueous solution of sodium silicate JIS No. 3 (the mole ratio of $SiO_2/Na_2O$ being 3.1 to 3.3) kept at 75° C. After thorough water-washing followed by drying, the plate was coated on the grained surface with a solution (1) of the following composition to form a double layer in dry weight proportions of 1 g/m² and 0.3 g/m², respectively, and then dried. A first order transition point of the thus formed photosensitive layer was 230° C. Composition of solution (1):

Copolymer of styrene, p-hydroxyphenyl methacrylamide, methyl methacrylate, and methacrylic acid (mole ratio: 3:3:3:1): 10 g
Condensate of hexafluorophosphate of 4-diazo-4'-phenylamine with formaldehyde: 0.8 g
Methyl cellosolve: 100 ml Each of the aluminum plates thus treated was sprayed with a spray gun on the surface of the photosensitive layer with powder of each resin indicated in Table 3, which powder was obtained by pulverizing and classifying the resin in the same manner as in Example 1, and immediately thereafter the powdered surface of the photosensitive layer was brought into contact with a feed roll heated to 215° C. to stick the powder fast thereto. Using the samples thus obtained, the measurements were conducted to obtain the time required for attaining vacuum contact in case where (column I) each sample as obtained was measured according to the vacuum contact method, (column II) each sample as obtained was measured likewise but after being wiped on the surface with a cotton glove, (column III) each sample as obtained, but not subjected to the sticking step but only to powdering, was measured likewise, and each sample not subjected at all to powdering was measured. The results obtained were as shown in Table 3.

TABLE 3

| Resin used | 1st transition point (°C.) | 2nd transition point (°C.) | Particle diameter of powder (μ) | Amount of powder per 1 mm² (number of particles) | Vacuum contact time (second) (I) | (II) | (III) |
| --- | --- | --- | --- | --- | --- | --- | --- |
| meta-Cresol-formaldehyde novolak resin | 85 | — | 1–9 | 98 | 48 | 49 | 151 |
| Copolymer (5:5:1) of styrene, methyl methacrylate and butyl acrylate | 95 | 60 | 5–8 | 52 | 59 | 62 | 140 |
| Polyacrylic acid | — | 106 | 2–6 | 72 | 52 | 53 | 160 |
| Polyhydroxy styrene | 160–200 | — | 2–9 | 127 | 42 | 46 | 143 |
| Blank | — | — | — | — | | 165 | |

It is understood from the above table that in the case of the present samples the effect on shortening of the vacuum contact time was marked and stickness of the solid powder stuck fast to the surface of the photosensitive layer was strengthened. The negative type photosensitive printing plates prepared above were individually brought into close contact with an original and then exposed for 2 minutes to light from a carbon arc lamp of 30 A at the distance of 70 cm. The exposed plates were individually developed for 15 seconds with a developer of the following composition, whereupon the solid powder stuck fast by powdering to the surface of the photosensitive layer was quickly removed therefrom and no difference by comparison in finish of the photosensitive printing plates was observed therebetween.

Composition of developer:
Methanol: 10 g
Water: 80 g
Sodium hydroxide: 1 g

EXAMPLE 4

A zinc plate of 2 mm in thickness was surface treated by immersing it in an electrolytic bath comprising 4% zinc sulfate at 30° C. and 1% sodium sulfate and applying thereto for 20 minutes an electric current in a proportion of 0.5 A/1 dm², followed by water-washing, and thereafter the plate was coated on the surface with a solution of the following composition in a proportion of 8 g/m².

α-Tribromomethylsulfonylbenzthiazole: 6 g
Copolymer of N-ethyl-N-phenylaminoethyl methacrylate and methacrylic acid in the proportion of 4:6: 0.4 g
N,N-Di(β-benzyloxyethyl)aniline: 0.4 g
Dioxane: 100 g Each of the thus coated plates was dried by blowing against the coated surface for 1 minute a hot air kept at 50° C. (a first stage) and then maintaining the hot air at 70° C. (a second stage) for continuing the drying. At the time immediately after completion of the drying at the first stage, namely, where about 10% of the solvent still remained in the coated surface, a solid powder of each resin indicated in Table 4 was sprayed with a spray gun on said coated surface. Subsequently, the measurements were conducted in the same manner as in Example 2 to obtain the results as shown in Table 4.

TABLE 4

| Resin used | Particle diameter of powder (μ) | Amount of powder per 1 mm² (number of particles) | Vacuum contact time (sec.) | | |
|---|---|---|---|---|---|
| | | | (I) | (II) | (III) |
| Phenol-formaldehyde novolak resin | 0.5-12 | 20 | 75 | 78 | 182 |
| Hydroxypropyl methylcellulose | 1-8 | 48 | 68 | 70 | 178 |
| Carboxymethyl-cellulose | 2-9 | 63 | 60 | 61 | 185 |
| Polyacrylic acid | 2-8 | 91 | 45 | 45 | 180 |
| Blank | — | — | | | 180 |

It is understood from Table 4 that in the case of the photosensitive relief printing plates to which the solid powder was allowed to stick fast according to the present invention by the use of the remaining organic solvent, the vacuum contact time could effectively be shortened. As a result of development of the present photosensitive relief printing plates with a 0.05% aqueous sodium hydroxide solution, furthermore, it was found that the powder stuck fast to the plates did not exert at all any adverse effect on both the image area and non-image area and printing characteristics of the present plates did not differ at all from those of the plates free from the solid powder.

What we claim is:

1. A method for manufacturing a photosensitive printing plate having a photosensitive layer having photosensitive material therein and a powder distributed on a surface of said photosensitive layer, said method comprising
    (a) providing said powder on said surface by powdering conducted with gas, wherein said powder is an organic polymer soluble in a solvent or a mixture of solvents used for development of said photosensitive plate and particles of said powder have diameters of 0.5 to 40 μ, and
    (b) sticking said powder fast to said surface by application of heat so that said powder is removable therefrom only by dissolution by said solvent or said mixture during said development, wherein said powder is present on said surface in an amount of 0.5 to 1,000 particles per square millimeter.

2. The method of claim 1 wherein said heat is applied at a temperature of 50° to 300° C.

3. The method of claim 1 wherein said solvent is capable of dissolving said powder and has a boiling point of 50° to 200° C.

4. The method of claim 1 wherein said development comprises treating said plate with an aqueous silicate solution or a solution containing alcohols, ketones and-/or ethers.

5. The method of claim 1 wherein said diameters are 5 to 30 μ.

6. The method of claim 1 wherein the first and second transition points of said powder are greater than 40° C. and are lower than the first transition point of said photosensitive layer.

7. The method of claim 1 wherein said organic polymer is a homopolymer or copolymer of acrylic acid, methacrylic acid, acrylate, methacrylate or styrene.

8. The method of claim 1 wherein said powder comprises polybutylmethacrylate.

9. The method of claim 1 wherein said powder is applied to said surface when said surface is at least about halfway dry.

10. The method of claim 1 wherein said organic polymer comprises a homopolymer or copolymer of acrylic acid, methacrylic acid, acrylate, methacrylate, styrene, vinyl pyrrolidone, vinyl alcohol, and/or phenolic resins.

11. The method of claim 1 wherein said organic polymer has a molecular weight of 5,000 to 200,000.

12. The method of claim 1 wherein said coating solvent is selected from the group consisting of methylcellosolve, ethylcellosolve, methylcellosolve acetate, and ethylcellosolve acetate.

13. The method of claim 1 wherein said photosensitive layer comprises an o-diazo oxide or a diazo resin as a photosensitive material.

14. The method of claim 1 wherein said diameters are 5 to 30 μm.

15. The method of claim 1 wherein said photosensitive material is an o-diazo oxide or a diazo resin.

* * * * *